United States Patent
Ono et al.

(10) Patent No.: US 11,107,885 B2
(45) Date of Patent: *Aug. 31, 2021

(54) SEMICONDUCTOR FILM, SOLAR CELL, LIGHT-EMITTING DIODE, THIN FILM TRANSISTOR, AND ELECTRONIC DEVICE

(71) Applicant: FUJIFILM Corporation, Tokyo (JP)

(72) Inventors: Masashi Ono, Kanagawa (JP); Makoto Kikuchi, Kanagawa (JP); Atsushi Tanaka, Kanagawa (JP); Masayuki Suzuki, Kanagawa (JP); Yoshihiko Kanemitsu, Kyoto (JP)

(73) Assignee: FUJIFILM Corporation, Tokyo (JP)

( * ) Notice: Subject to any disclaimer, the term of this patent is extended or adjusted under 35 U.S.C. 154(b) by 163 days.

This patent is subject to a terminal disclaimer.

(21) Appl. No.: 15/850,637

(22) Filed: Dec. 21, 2017

(65) Prior Publication Data

US 2018/0138267 A1    May 17, 2018

Related U.S. Application Data

(60) Division of application No. 14/726,827, filed on Jun. 1, 2015, now abandoned, which is a continuation of
(Continued)

(30) Foreign Application Priority Data

Dec. 26, 2012 (JP) ................................. 2012-283030

(51) Int. Cl.
*H01L 31/0352* (2006.01)
*H01L 29/24* (2006.01)
(Continued)

(52) U.S. Cl.
CPC .......... *H01L 29/0665* (2013.01); *B82Y 10/00* (2013.01); *B82Y 30/00* (2013.01);
(Continued)

(58) Field of Classification Search
CPC ................. H01L 29/0665; H01L 29/24; H01L 29/78696; H01L 29/125; H01L 31/032;
(Continued)

(56) References Cited

U.S. PATENT DOCUMENTS

| 8,574,685 B1 * | 11/2013 | Lewis ..................... H05C 1/00 427/472 |
| 2003/0157325 A1 * | 8/2003 | Anders .................... G11B 5/65 428/402 |

(Continued)

FOREIGN PATENT DOCUMENTS

| JP | 442570 B2 | 3/2010 | |
| WO | WO-2012071107 A1 * | 5/2012 | ..... H01L 31/035218 |

OTHER PUBLICATIONS

Koh et al.,Thiocyanate-Capped PbS Nanocubes: Ambipolar Transport Enables Quantum Dot Based Circuits on a Flexible Substrate , Nano Lett. 2011, 11,4764-4767 (Year: 2011).*

(Continued)

*Primary Examiner* — Francisco W Tschen
(74) *Attorney, Agent, or Firm* — Birch, Stewart, Kolasch & Birch, LLP

(57) ABSTRACT

A semiconductor film includes a cluster of semiconductor quantum dots each having a metal atom and ligands coordinating to respective semiconductor quantum dots, and the semiconductor quantum dots have an average shortest inter-dot distance of less than 0.45 nm. A solar cell, a light-emitting diode, a thin film transistor, and an electronic device include the semiconductor film.

13 Claims, 5 Drawing Sheets

Related U.S. Application Data application No. PCT/JP2013/080407, filed on Nov. 11, 2013.

(51) Int. Cl.

| | |
|---|---|
| *H01L 33/26* | (2010.01) |
| *H01L 29/786* | (2006.01) |
| *H01L 33/06* | (2010.01) |
| *H01L 29/06* | (2006.01) |
| *H01L 31/0392* | (2006.01) |
| *H01L 31/072* | (2012.01) |
| *B82Y 30/00* | (2011.01) |
| *B82Y 10/00* | (2011.01) |
| *H01L 29/12* | (2006.01) |
| *H01L 31/032* | (2006.01) |
| *H01L 51/50* | (2006.01) |

(52) U.S. Cl.
CPC ............ *H01L 29/125* (2013.01); *H01L 29/24* (2013.01); *H01L 29/78696* (2013.01); *H01L 31/032* (2013.01); *H01L 31/0392* (2013.01); *H01L 31/035218* (2013.01); *H01L 31/072* (2013.01); *H01L 33/06* (2013.01); *H01L 33/26* (2013.01); *H01L 51/502* (2013.01); *Y02E 10/50* (2013.01)

(58) Field of Classification Search
CPC ......... H01L 31/035218; H01L 31/0392; H01L 31/072; H01L 33/06; H01L 33/26; B82Y 10/00; B82Y 30/00; Y02E 10/50
See application file for complete search history.

(56) References Cited

U.S. PATENT DOCUMENTS

| | | | |
|---|---|---|---|
| 2008/0066802 A1* | 3/2008 | Reddy ................ | H01L 51/0049 136/258 |
| 2009/0314991 A1* | 12/2009 | Cho ....................... | C09D 11/36 252/301.36 |
| 2010/0159249 A1* | 6/2010 | Jang ....................... | H05B 33/14 428/403 |

OTHER PUBLICATIONS

Fafarman et al., Thiocyanate-Capped Nanocrystal Colloids: Vibrational Reporter of Surface Chemistry and Solution-Based Route to Enhanced Coupling in Nanocrystal Solids, J.Am.Chem. Soc. 2011, 133, 15753-15761 (Year: 2011).*

Geyer et al., "Charge transport in mixed CdSe and CdTe colloidal nanocrystal film", Physical Review B 82, 155201, (2010).

International Search Report, issued in PCT/JP2013/080407, dated Jan. 14, 2014.

Luther et al., "Structural, Optical, and Electrical Properties of Self-Assembled Films of PbSe Nanocrystals Treated with 1,2-Ethanedithiol", ACS Nano, vol. 2, No. 2, 271-280, (2008).

Written Opinion of the International Searching Authority, issued in PCT/JP2013/080407, dated Jan. 14, 2014.

Final Office Action dated Feb. 28, 2017, issued in U.S. Appl. No. 14/726,827.

https://pubchem.ncbi.nlm.nih.gov/compound/6058,"2Aminoethanethiol", accessed Aug. 16, 2016.

Kenji Hamaguchi et al., Photochemical synthesis of glycine-stabilized gold nanoparticles and its heavy-metal-induced aggregation behavior; Colloids and Surfaces A: Physiochemical Engineering Aspects,vol. 367, pp. 167-173 (2010).

Non-Final Office Action dated Aug. 26, 2016, issued in U.S. Appl. No. 14/726,827.

Non-Final Office Action dated Sep. 22, 2017, issued in U.S. Appl. No. 14/726,827.

Tsukasa Torimoto et. al.; Preparation and Photoelectrochemical Properties of Two-Dimensionally Organized CdS Nanoparticle Thin Films; Langmuir, vol. 15, pp. 1853-1858 (1999).

* cited by examiner

SEMICONDUCTOR FILM, SOLAR CELL, LIGHT-EMITTING DIODE, THIN FILM TRANSISTOR, AND ELECTRONIC DEVICE

CROSS-REFERENCE TO RELATED APPLICATIONS

This application is a divisional application of pending U.S. application Ser. No. 14/726,827 filed on Jun. 1, 2015, which is a continuation of International Application No. PCT/JP2013/080407, filed Nov. 11, 2013, which claims the benefit of priority of Japanese Patent Application No. 2012-283030 filed in Japan on Dec. 26, 2012. The entire contents of all of the above applications are hereby incorporated by reference.

TECHNICAL FIELD

The present invention relates to a semiconductor film, a solar cell, a light-emitting diode, a thin film transistor, and an electronic device.

BACKGROUND ART

In recent years, high-efficiency solar cells referred to as third-generation solar cells have been actively studied. Among them, solar cells in which colloidal quantum dots are used are reported to be able to increase the quantum efficiency due to, for example, the multiexciton generation effect, and they are attracting attention. However, solar cells in which colloidal quantum dots are used (also referred to as quantum dot solar cells) exhibit a conversion efficiency of about 7% at most, and a further increase in the conversion efficiency is desired.

In such quantum dot solar cells, a semiconductor film constituted of a cluster of quantum dots serves as a photoelectric conversion layer, and, therefore, semiconductor films constituted of a cluster of quantum dots are themselves being actively studied.

For example, semiconductor nanoparticles in which relatively long ligands having six or more hydrocarbon groups are used are disclosed (for example, see Japanese Patent No. 4425470).

With respect to methods for improving the characteristics of semiconductor films constituted of a cluster of quantum dots, it is reported that replacing ligand molecules bonded to quantum dots (for example, about 2 nm to about 10 nm) by shorter ligand molecules increases electrical conductivity (for example, see S. Geyer, et al., "Charge transport in mixed CdSe and CdTe colloidal nanocrystal films", Physical Review B (2010)). In "Structural, Optical, and Electrical Properties of Self-Assembled Films of PbSe Nanocrystals Treated with 1,2-Ethanedithiol" (J. M. Luther, et al., ACS Nano (2008)), it is reported that replacing oleic acid (having a molecular chain length of about 2 nm to about 3 nm) around PbSe quantum dots by ethanedithiol (having a molecular chain length of 1 nm or shorter) causes quantum dots to come closer to each other, thereby increasing the electrical conductivity.

SUMMARY OF INVENTION

However, the semiconductor film described in Japanese Patent No. 4425470 includes large ligands, and the degree to which semiconductor quantum dots come close to each other is insufficient. Therefore, the photoelectric conversion characteristics of the semiconductor film described in Japanese Patent No. 4425470 are not favorable. Also when butylamine, which is used in "Charge transport in mixed CdSe and CdTe colloidal nanocrystal films" (S. Geyer, et al., Physical Review B (2010)), or ethanedithiol, which is used in "Structural, Optical, and Electrical Properties of Self-Assembled Films of PbSe Nanocrystals Treated with 1,2-Ethanedithiol" (J. M. Luther, et al., ACS Nano (2008)), is used as ligands, a photocurrent value of only about several hundreds of nanoamperes at most can be obtained, according to, for example, "Charge transport in mixed CdSe and CdTe colloidal nanocrystal films" (S. Geyer, et al., Physical Review B (2010)). Further, when ethanedithiol is used as ligands, film detachment of the semiconductor film easily occurs.

The present invention addresses provision of a semiconductor film with which a high photocurrent value can be achieved and in which occurrence of film detachment is suppressed.

The invention also addresses provision of a solar cell, a light-emitting diode, a thin film transistor, and an electronic device with which a high photocurrent value can be achieved and in which occurrence of film detachment is suppressed.

Aspects of the invention include the following:

<1> A semiconductor film which includes a cluster of semiconductor quantum dots each having a metal atom and ligands coordinating to respective semiconductor quantum dots, the semiconductor quantum dots having an average shortest inter-dot distance of less than 0.45 nm.

<2> The semiconductor film according to <1>, in which the semiconductor quantum dots have an average shortest inter-dot distance of less than 0.30 nm.

<3> The semiconductor film according to <1>, in which the semiconductor quantum dots have an average shortest inter-dot distance of less than 0.20 nm.

<4> The semiconductor film according to any one of <1> to <3>, in which the semiconductor quantum dots are at least one selected from the group consisting of PbS, PbSe, InN, InAs, InSb, and InP.

<5> The semiconductor film according to any one of <1> to <4>, in which an average particle diameter of the semiconductor quantum dots is from 2 nm to 15 nm.

<6> The semiconductor film according to <4> or <5>, in which the semiconductor quantum dots are PbS.

<7> A solar cell including the semiconductor film according to any one of <1> to <6>.

<8> A light-emitting diode including the semiconductor film according to any one of <1> to <6>.

<9> A thin film transistor including the semiconductor film according to any one of <1> to <6>.

<10> An electronic device including the semiconductor film according to any one of <1> to <6>.

According to the invention, a semiconductor film with which a high photocurrent value can be achieved and in which film detachment is suppressed can be provided.

According to the invention, a solar cell, a light-emitting diode, a thin film transistor, and an electronic device with which a high photocurrent value can be achieved and in which film detachment is suppressed can be provided.

DESCRIPTION OF EMBODIMENTS

Figure 1:
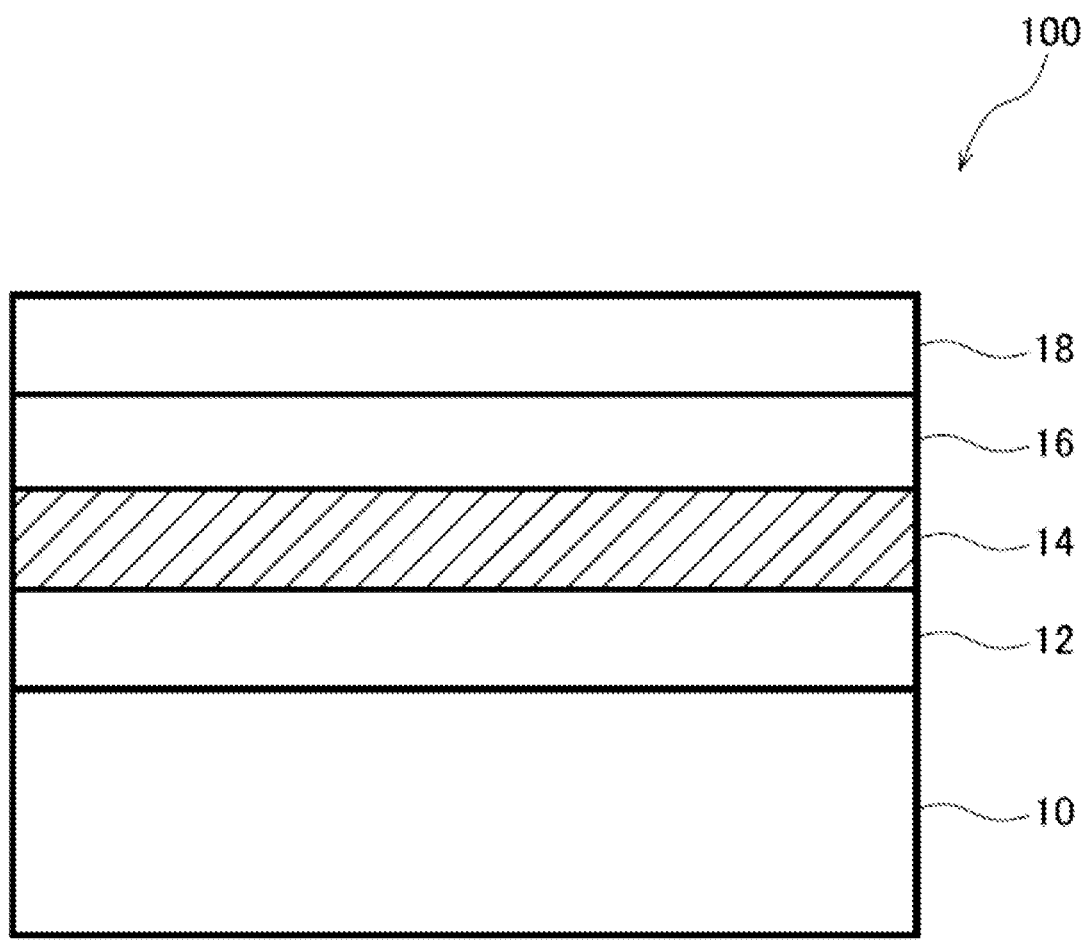
FIG. 1 is a schematic view illustrating an example of a configuration of a p-n junction solar cell in which a semiconductor film according to the invention is employed.

Hereinafter, a semiconductor film and a method of manufacturing the semiconductor film according to the invention are described in detail.

<Semiconductor Film>

A semiconductor film according to the invention includes a cluster of semiconductor quantum dots each having a metal atom and ligands coordinating to respective semiconductor quantum dots, and the semiconductor quantum dots have an average shortest inter-dot distance of less than 0.45 nm.

The semiconductor quantum dots are semiconductor particles that are configured to contain a metal atom, and that are nano-sized particles having a particle diameter of several nanometers to several tens of nanometers. The cluster of semiconductor quantum dots refers to a structure in which many semiconductor quantum dots (for example, 100 or more semiconductor quantum dots per 1 μm² square) are arranged in close proximity to each other.

The "semiconductor" as used in the invention means a substance having a specific resistance value of from $10^{-2}$ Ωcm to $10^8$ Ωcm.

In the invention, the scope of the metal atoms for constituting semiconductor quantum dots include semimetal atoms, a representative example of which is a Si atom.

Examples of semiconductor quantum dot materials for constituting semiconductor quantum dots include nanoparticles (particles having a size of from 0.5 nm to less than 100 nm) of a general semiconductor crystal [a) a group IV semiconductor, b) a compound semiconductor of group IV-IV, group or group II-VI, and c) a compound semiconductor composed of a combination of three or more selected from group II, group III, group IV, group V, and group VI elements]. Specific examples of semiconductor quantum dot materials include semiconductor materials having a relatively narrow band gap, such as PbS, PbSe, InN, InAs, Ge, InAs, InGaAs, CuInS, CuInSe, CuInGaSe, InSb, Si, and InP.

The semiconductor quantum dots include at least one semiconductor quantum dot material.

The semiconductor quantum dot material preferably has a bulk band gap of 1.5 eV or smaller. Using such a semiconductor material having a relatively narrow band gap enables achievement of a high conversion efficiency when, for example, the semiconductor film according to the invention is used as a photoelectric conversion layer of a solar cell.

The semiconductor quantum dots may have a core-shell structure in which a semiconductor quantum dot material serves as a core, and in which the semiconductor quantum dot material is covered with a coating compound. Examples of the coating compound include ZnS, ZnSe, ZnTe, and ZnCdS.

Among the above materials, the semiconductor quantum dot material is preferably PbS or PbSe due to ease of synthesis of semiconductor quantum dots thereof. Using InN is also preferable in consideration of small environmental load thereof.

When the semiconductor film according to the invention is used in solar cell applications, it is preferable that the semiconductor quantum dots have a still narrower band gap with a view to enhancement of the photoelectric conversion efficiency due to the multiexciton generation effect. More specifically, the band gap is preferably 1.0 eV or smaller.

From the viewpoint of obtaining a still narrower band gap and enhancing the multiexciton generation effect, the semiconductor quantum dot material is preferably PbS, PbSe, or InSb.

The average particle diameter of the semiconductor quantum dots is preferably from 2 nm to 15 nm. The average particle diameter of the semiconductor quantum dots means the average particle diameter of ten semiconductor quantum dots. The particle diameters of semiconductor quantum dots can be measured using a transmission electron microscope. The "average particle diameter" of semiconductor quantum dots in the present specification refers to a number average particle diameter, unless specified otherwise. Namely, the number average particle diameter of the semiconductor quantum dots is preferably from 2 nm to 15 nm.

Semiconductor quantum dots generally include particles having various sizes of from several nanometers to several tens of nanometers. In semiconductor quantum dots, when the average particle diameter of the quantum dots is decreased to a size that is equal to or smaller than the Bohr radius of electrons that are inherently present therein, a phenomenon that the band gap of the semiconductor quantum dots changes due to the quantum size effect occurs. For example, the Bohr radius is relatively large in group II-VI semiconductors, and the Bohr radius in PbS is said to be about 18 nm. InP, which is a III-V group semiconductor, is said to have a Bohr radius of about 10 nm to about 14 nm.

Accordingly, when the average particle diameter of the semiconductor quantum dots is, for example, 15 nm or less, the band gap can be controlled by the quantum size effect.

In particular, when the semiconductor film according to the invention is applied to a solar cell, it is important that the band gap be adjusted to the optimum value through the quantum size effect, regardless of what semiconductor quantum dot material is used. In general, the smaller the average particle diameter of the semiconductor quantum dots is, the larger the band gap is. Therefore, when the average particle diameter of the semiconductor quantum dots is 10 nm or less, a larger change in the band gap can be expected. Therefore, the size (number average particle diameter) of the quantum dots is preferably 10 nm or less since the band gap thereof can easily be adjusted to a value optimum for the spectrum of sunlight even when the semiconductor quantum dots are a narrow-gap semiconductor.

When the average particle diameter of the semiconductor quantum dots is small and quantum confinement is remarkable, there is also an advantage in that an increase in the multiexciton generation effect can be expected.

The average particle diameter (number average particle diameter) of the semiconductor quantum dots is preferably 2 nm or more. When the average particle diameter of the semiconductor quantum dots is 2 nm or more, the quantum confinement effect is not excessively strong, and the band gap can easily be adjusted to the optimum value. Setting the average particle diameter of the semiconductor quantum dots to be 2 nm or more makes it easy to control the crystal growth of the semiconductor quantum dots during the synthesis of the semiconductor quantum dots.

In the film configured by including a cluster of semiconductor quantum dots, a large inter-dot distance (spacing) between the semiconductor quantum dots leads to a decrease in the electrical conductivity, and the film becomes an insulator. Decreasing the inter-dot distance between the semiconductor quantum dots improves the electrical conductivity, and enables a semiconductor film having a high photocurrent value to be obtained.

Adopting a configuration in which a semiconductor film includes a cluster of semiconductor quantum dots each having a metal atom and specific ligands coordinating to respective semiconductor quantum dots enables an average shortest distance between the dots of less than 0.45 nm.

Here, the average shortest inter-dot distance between semiconductor quantum dots means the average value of the shortest distance between the surface of one semiconductor quantum dot A and the surface of another semiconductor quantum dot B adjacent to the semiconductor quantum dot A. More specifically, the average shortest inter-dot distance is calculated as follows.

The average shortest inter-dot distance between semiconductor quantum dots can be obtained by structure evaluation of a quantum dot film including semiconductor quantum dots using grazing incidence small angle X-ray scattering (GISAXS). Through this measurement, a center-to-center distance d between adjacent semiconductor quantum dots can be obtained. The shortest inter-dot distance is calculated by subtracting the particle diameter of the semiconductor quantum dot from the obtained center-to-center distance d.

In the structure evaluation of the semiconductor film using a GISAXS measuring instrument, the average of scattered X-rays from the semiconductor quantum dots present in the entire region irradiated with X-rays is detected as scattered X-rays from the object to be measured. The shortest inter-dot distance calculated from the detected scattered X-rays is the "average shortest inter-dot distance", which is the average value of the shortest inter-dot distances.

It is conceivable that that the smaller the average shortest inter-dot distance of semiconductor quantum dots is, the greater the photocurrent value of the semiconductor film is. However, a configuration in which the average shortest inter-dot distance is 0 nm, i.e., a configuration in which semiconductor quantum dots contact with one another and aggregate, is equivalent to a bulk semiconductor, and the characteristics of nanosized semiconductor quantum dots cannot be obtained with such a configuration. Therefore, the average shortest inter-dot distance of semiconductor quantum dots is preferably more than 0 nm.

In the invention, the average shortest inter-dot distance of the semiconductor quantum dot is more preferably less than 0.30 nm, and still more preferably less than 0.20 nm.

Although the thickness of the semiconductor film is not particularly limited, the thickness of the semiconductor film is preferably 10 nm or more, and more preferably 50 nm or more, from the viewpoint of obtaining high electrical conductivity. However, the thickness of the semiconductor film is preferably 300 nm or less in consideration of preventing the carrier concentration from becoming too high and facilitating manufacturing.

<Method of Manufacturing Semiconductor Film>

Methods employed for manufacturing a semiconductor film according to the invention are not particularly limited. From the viewpoint of further decreasing the spacing between the semiconductor quantum dots and densely arranging the semiconductor quantum dots, a method is preferable which includes forming a cluster of semiconductor quantum dots using a semiconductor quantum dot dispersion liquid that includes semiconductor quantum dots to which first ligands having a relatively long molecular chain coordinate, and thereafter replacing the first ligands by specific ligands (second ligands) having a shorter molecular chain than that of the first ligands, thereby decreasing the spacing between the semiconductor quantum dots.

Methods of manufacturing a semiconductor film according to the invention are specifically described below.

(1) First Embodiment

A method of manufacturing a semiconductor film according to a first embodiment includes:

a semiconductor quantum dot cluster formation process of applying a semiconductor quantum dot dispersion liquid onto a substrate to form a cluster of semiconductor quantum dots, the semiconductor quantum dot dispersion liquid including semiconductor quantum dots each having a metal atom, first ligands coordinating to respective semiconductor quantum dots, and a first solvent; and a ligand exchange process of applying, to the cluster of semiconductor quantum dots, a solution that includes second ligands (hereinafter also referred to as "specific amine-based ligands") and a second solvent, thereby replacing the first ligands, which coordinate to the semiconductor quantum dots, by the second ligands, the second ligands having a molecular chain length shorter than that of the first ligands, and the second ligands being of at least one kind selected from the group consisting of a ligand represented by Formula (A), a ligand represented by Formula (B), and a ligand represented by Formula (C).

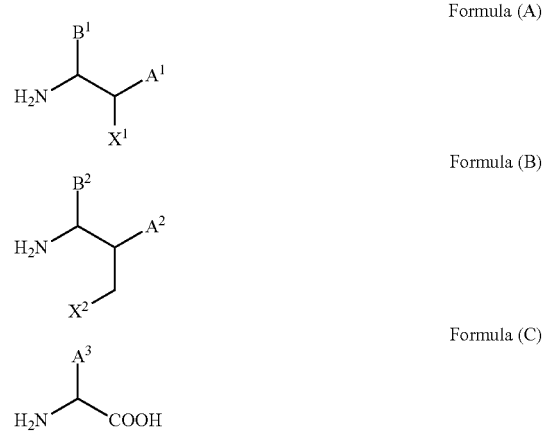

In Formula (A), $X^1$ represents —SH, —NH$_2$, or —OH, and each of $A^1$ and $B^1$ independently represents a hydrogen atom or a substituent having from 1 to 10 atoms, provided that, when both $A^1$ and $B^1$ are hydrogen atoms, $X^1$ represents —SH or —OH.

In Formula (B), $X^2$ represents —SH, —NH$_2$, or —OH, and each of $A^2$ and $B^2$ independently represents a hydrogen atom or a substituent having from 1 to 10 atoms.

In Formula (C), $A^3$ represents a hydrogen atom or a substituent having from 1 to 10 atoms.

In the semiconductor quantum dot cluster formation process in the method of manufacturing a semiconductor film according to the present embodiment, the semiconductor quantum dot dispersion liquid is applied onto a substrate, thereby forming a cluster of semiconductor quantum dots on the substrate. In this process, since the semiconductor quantum dots are dispersed in the first solvent due to the presence of the first ligands having a longer molecular chain length than that of the second ligands, the semiconductor quantum dots have lower tendency to take an aggregated bulk form. Accordingly, the cluster of semiconductor quantum dots can take a configuration in which the semiconductor quantum dots are individually arranged, when the semiconductor quantum dot dispersion liquid is applied to a substrate.

Subsequently, in the ligand exchange process, the solution of the specific amine-based ligands is applied to the cluster of semiconductor quantum dots, whereby the first ligands having a longer molecular chain length than that of the second ligands and coordinating to the semiconductor quantum dots are replaced by the second ligands (specific amine-based ligands). The specific amine-based ligands have an amino group in a molecule thereof, as illustrated in Formulae (A) to (C). An amino group has a high complex stability constant, and, in Formulae (A) and (B), it is conceivable that amino groups promotes formation of a complex of a metal atom in each semiconductor quantum dot and —SH, —NH$_2$, or —OH represented by $X^1$ (or $X^2$). In Formula (C), it is conceivable that the amino group promotes formation of a complex of a metal atom in each semiconductor quantum dot and OH in the carboxy group. Accordingly, it is conceivable that the second ligands (specific amine-based ligands) coordinate in place of the first ligands having a longer molecular chain length than that of the second ligands, and that the second ligands form coordination bonds with semiconductor quantum dots, thereby making it easier for the semiconductor quantum dots to come closer to each other. It is conceivable that the semiconductor quantum dots coming closer to each other increases the electrical conductivity of the cluster of semiconductor quantum dots, and enables provision of a semiconductor film having a high photocurrent value.

It is conceivable that chelate coordination of the specific ligands reduces an influence from steric hindrance, and makes the semiconductor quantum dots to come quite close to each other, as a result of which the cluster of semiconductor quantum dots becomes a strong semiconductor film, and becomes difficult to detach from the substrate.

The respective processes are specifically described below.

Semiconductor Quantum Dot Cluster Formation Process

In the semiconductor quantum dot cluster formation process, the semiconductor quantum dot dispersion liquid that includes semiconductor quantum dots, the first ligands coordinating to respective semiconductor quantum dots, and the first solvent is applied to a substrate, to form a cluster of semiconductor quantum dots.

The semiconductor quantum dot dispersion liquid may be applied to either a surface of the substrate or another layer provided on the substrate.

Examples of another layer provided on the substrate include an adhesion layer for improving the adhesion between the substrate and the cluster of semiconductor quantum dots, and a transparent conductive layer.

Semiconductor Quantum Dot Dispersion Liquid

The semiconductor quantum dot dispersion liquid includes semiconductor quantum dots each having a metal atom, the first ligands, and the first solvent.

The semiconductor quantum dot dispersion liquid may further include other components as far as the effects of the invention are not impaired.

(Semiconductor Quantum Dot)

The details of the semiconductor quantum dots containing a metal atom in the semiconductor quantum dot dispersion liquid are as described above, and preferred embodiments thereof are also the same as those described above.

The content of semiconductor quantum dots in the semiconductor quantum dot dispersion liquid is preferably from 1 mg/ml to 100 mg/ml, and more preferably from 5 mg/ml to 40 mg/ml.

A content of semiconductor quantum dots in the semiconductor quantum dot dispersion liquid of 1 mg/ml or higher provides a high semiconductor quantum dot density on the substrate, and makes it easy to obtain a favorable film. Meanwhile, a content of semiconductor quantum dots of 100 mg/ml or lower makes the thickness of a film obtained by one time application of the semiconductor quantum dot dispersion liquid less likely to become large. Therefore, ligand exchange from the first ligands coordinating to respective semiconductor quantum dots in the film can sufficiently be performed.

(First Ligands)

The first ligands contained in the semiconductor quantum dot dispersion liquid work as ligands coordinating to respective semiconductor quantum dots, and also serve as a dispersant for dispersing the semiconductor quantum dots in the first solvent due to their molecular structure, which tends to cause steric hindrance.

The molecular chain length of the first ligands is longer than that of the after-mentioned second ligands. When there is a branched structure in the molecule, whether the molecular chain length is longer or shorter is determined from the length of the main chain. The ligands represented by Formula (A), the ligands represented by Formula (B), and the ligands represented by Formula (C), which can work as the second ligands, are inherently hard to disperse in organic solvent systems, and these ligands do not correspond to the first ligands. Here, the dispersion refers to a state in which sedimentation of particles or clouding does not occur.

From the viewpoint of improving the dispersion of the semiconductor quantum dots, the first ligands are preferably ligands each having a main chain having 6 or more carbon atoms, and more preferably ligands each having a main chain having 10 or more carbon atoms.

Specifically, the first ligands may be a saturated compound or an unsaturated compound, and examples thereof include decanoic acid, lauric acid, myristic acid, palmitic acid, stearic acid, behenic acid, oleic acid, erucic acid, oleylamine, dodecylamine, dodecanethiol, 1,2-hexadecanethiol, trioctyl phosphine oxide, and cetrimonium bromide.

The first ligands preferably have a lower tendency to remain in the film during the formation of the semiconductor film.

Among those described above, the first ligands are preferably at least one of oleic acid or oleylamine from the viewpoints of imparting dispersion stability to the semiconductor quantum dots and possessing a lower tendency to remain in the semiconductor film.

The content of the first ligands in the semiconductor quantum dot dispersion liquid is preferably from 10 mmol/l to 200 mmol/l with respect to the total volume of the semiconductor quantum dot dispersion liquid.

(First Solvent)

The first solvent contained in the semiconductor quantum dot dispersion liquid is not particularly limited. The first solvent is preferably a solvent that hardly dissolves the semiconductor quantum dots but easily dissolves the first ligands. The first solvent is preferably an organic solvent, specific examples of which include alkanes (for example, n-hexane, n-octane, and the like), benzene, and toluene.

The first solvent may be used singly, or may be a mixed solvent obtainable by mixing two or more solvents.

The first solvent is preferably a solvent having a lower tendency to remain in the semiconductor film to be formed, among the solvents described above. In the case of using a solvent having a relatively low boiling point, the content of residual organic matter in the finally obtained semiconductor film can be regulated to be a low value.

Solvents having high wettability with respect to the substrate are naturally preferred. For example, in the case of application to a glass substrate, alkanes such as hexane or octane are more preferred.

The content of the first solvent in the semiconductor quantum dot dispersion liquid is preferably from 90% by mass to 98% by mass with respect to the total mass of the semiconductor quantum dot dispersion liquid.

Substrate

The semiconductor quantum dot dispersion liquid is applied to a substrate.

The shape, structure, size, and the like of the substrate are not particularly limited, and may be selected, as appropriate, in accordance with the purpose. The structure of the substrate may be a single layer structure or a multilayer structure. Examples of substrates that can be used include a substrate formed of an inorganic material such as glass or YSZ (Yttria-Stabilized Zirconia), a resin, a resin composite material, or the like. Among them, substrates formed of a resin or a resin composite material are preferable in consideration of the light weight and flexibility thereof.

Examples of resins include synthetic resins such as polybutylene terephthalate, polyethylene terephthalate, polyethylene naphthalate, polybutylene naphthalate, polystyrene, polycarbonate, polysulphone, polyether sulfone, polyarylate, allyl diglycol carbonate, polyamide, polyimide, polyamideimide, polyetherimide, polybenzazole, polyphenylene sulfide, polycycloolefin, norbornene resins, fluorine resins such as polychlorotrifluoroethylene, liquid crystal polymers, acrylic resins, epoxy resins, silicone resins, ionomer resins, cyanate resins, cross-linked fumaric acid diester, cyclic polyolefin, aromatic ether, maleimide-olefin, celluouse, and episulfide compounds.

Examples of composite materials of an inorganic material and a resin include a composite plastic material formed from a resin and any of the following inorganic materials. Specifically, examples thereof include a composite plastic material formed from a resin and silicon oxide particles, a composite plastic material formed from a resin and metal nanoparticles, a composite plastic material formed from a resin and inorganic oxide nanoparticles, a composite plastic material formed from a resin and inorganic nitride nanoparticles, a composite plastic material formed from a resin and carbon fibers, a composite plastic material formed from a resin and carbon nanotubes, a composite plastic material formed from a resin and glass flakes, a composite plastic material formed from a resin and glass fibers, a composite plastic material formed from a resin and glass beads, a composite plastic material formed from a resin and clay mineral, a composite plastic material formed from a resin and particles having a mica-derived crystal structure, a laminated plastic material having at least one contact interface between a resin and thin glass, and a composite material having a barrier function and at least one contact interface formed by alternately stacking inorganic layers and organic layers.

It is also possible to use a stainless substrate, a metal multilayer substrate in which stainless and another metal are disposed in layers, an aluminum substrate, an aluminum substrate which is provided with an oxide film and of which the insulating properties of the surface thereof have been improved by applying oxidation treatment (for example, anodization treatment) to the surface, or the like.

The substrate formed from a resin or a resin composite material (a resin substrate or a resin composite material substrate) preferably has excellent properties with respect to heat resistance, dimensional stability, solvent resistance, electrical insulating properties, workability, low air permeability, low hygroscopicity, and the like. The resin substrate and the resin composite material substrate may have, for example, a gas barrier layer for preventing permeation of water, oxygen, or the like, or an undercoat layer for improving the flatness of the resin substrate or the adhesion to a lower electrode.

A lower electrode, an insulating film, or the like may be provided on the substrate. In this case, the semiconductor quantum dot dispersion liquid is applied to the lower electrode or the insulating film provided on the substrate.

Although the thickness of the substrate is not particularly limited, the thickness is preferably from 50 µm to 1000 µm, and more preferably from 50 µm to 500 µm. A thickness of the substrate of 50 µm or more improves the flatness of the substrate itself, and a thickness of the substrate of 1000 µm or less improves the flexibility of the substrate itself, and makes it easier to use a semiconductor film as a flexible semiconductor device.

Methods employed for applying the semiconductor quantum dot dispersion liquid to the substrate are not particularly limited, and examples thereof include a method of applying the semiconductor quantum dot dispersion liquid to the substrate, and a method of immersing the substrate in the semiconductor quantum dot dispersion liquid.

More specific examples of methods for applying the semiconductor quantum dot dispersion liquid to the substrate include liquid phase methods such as a spin coating method, a dipping method, an ink jetting method, a dispenser method, a screen printing method, a letterpress printing method, an intaglio printing method, and a spray coating method.

In particular, an ink jetting method, a dispenser method, a screen printing method, a letterpress printing method, and an intaglio printing method enable a coating film to be formed at any position on the substrate, and, in addition, eliminate the necessity for a patterning process after film formation. Therefore, process cost can be reduced when using these methods.

Ligand Exchange Process

In the ligand exchange process, a solution that includes a second solvent and a second ligands (specific amine-based ligands) having a shorter molecular chain length than that of the first ligands and being at least one kind selected from the group consisting of a ligand represented by Formula (A), a ligand represented by Formula (B), and a ligand represented by Formula (C), is applied to the cluster of semiconductor quantum dots that has been formed on the substrate by the semiconductor quantum dot cluster formation process, whereby the first ligands coordinating to respective semiconductor quantum dots are replaced by the second ligands contained in the ligand solution.

Ligand Solution

The ligand solution contains at least the second ligands (specific amine-based ligands) and the second solvent. The ligand solution may further contain other components as far as the effects of the invention are not impaired.

(Second Ligands)

The second ligands are the specific amine-based ligands described above, which are at least one kind of ligand having a shorter molecular chain length than that of the first ligands and being selected from the group consisting of a ligand represented by Formula (A), a ligand represented by Formula (B), and a ligand represented by Formula (C).

The method employed for determining whether the length of the molecular chains of the ligands is shorter or longer is the same as that described in the explanation of the first ligands.

When $A^1$ or $B^1$ in Formula (A), $A^2$ or $B^2$ in Formula (B), or $A^3$ in Formula (C) represents a substituent having from 1 to 10 atoms, examples of the substituent having from 1 to 10 atoms include alkyl groups having from 1 to 3 carbon atoms (a methyl group, an ethyl group, a propyl group, and an isopropyl group), alkenyl groups having 2 to 3 carbon atoms (an ethenyl group and a propenyl group), alkynyl groups having from 2 to 4 carbon atoms (an ethynyl group, a propynyl group, and the like), a cyclopropyl group, alkoxy groups having from 1 to 2 carbon atoms (a methoxy group and an ethoxy group), acyl groups having from 2 to 3 carbon atoms (an acetyl group and a propionyl group), alkoxycarbonyl groups having from 2 to 3 carbon atoms (a methoxycarbonyl group and an ethoxycarbonyl group), acyloxy groups having 2 carbon atoms (an acetyloxy group), acylamino groups having 2 carbon atoms (an acetylamino group), hydroxyalkyl groups having from 1 to 3 carbon atoms (a hydroxymethyl group, a hydroxyethyl group, and a hydroxypropyl group), an aldehyde group (—COH), a hydroxy group (—OH), a carboxy group (—COOH), a sulfo group (—SO$_3$H), a phospho group (—OPO(OH)$_2$), an amino group (—NH$_2$), a carbamoyl group (—CONH$_2$), a cyano group (—CN), an isocyanate group (—N=C=O), a thiol group (—SH), a nitro group (—NO$_2$), a nitroxy group (—ONO$_2$), an isothiocyanate group (—NCS), a cyanate group (—OCN), a thiocyanate group (—SCN), an acetoxy group (OCOCH$_3$), an acetamide group (NHCOCH$_3$), a formyl group (—CHO), a formyloxy group (—OCHO), a formamide group (—NHCHO), a sulfamino group (—NHSO$_3$H), a sulfino group (—SO$_2$H), a sulfamoyl group (—SO$_2$NH$_2$), a phosphono group (—PO$_3$H$_2$), an acetyl group (—COCH$_3$), halogen atoms (a fluorine atom, a chlorine atom, a bromine atom, and the like), and alkali metal atoms (a lithium atom, a sodium atom, a potassium, and the like).

As far as the total number of atoms in the substituent is 10 or fewer, the substituent may itself has a further substituent.

When the number of atoms in the substituent is 10 or fewer, steric hindrance due to the presence of ligands is reduced, and the semiconductor quantum dots can come closer to each other; therefore, the electrical conductivity of the semiconductor film can be enhanced.

It is preferable that the substituent has 7 or fewer atoms from the viewpoint of further reducing the spacing between the semiconductor quantum dots, and it is more preferable that the substituent is a hydrogen atom.

$X^1$ in Formula (A) and $X^2$ in Formula (B) are preferably —OH (a hydroxy group) in consideration of the solubility when an alcohol solution of the specific amine-based ligands is to be prepared.

Specific examples of the compound represented by Formula (A) include 2-aminoethanol, 2-aminoethane-1-thiol, 1-amino-2-butanol, 1-amino-2-pentanol, L-cystine, and D-cystine. Specific examples of the compound represented by Formula (B) include 3-amino-1-propanol, L-homoserine, and D-homoserine. Specific examples of the compound represented by Formula (C) include aminohydroxyacetic acid.

The specific amine-based ligands may be a derivative of a compound represented by Formula (A), a derivative of a compound represented by Formula (B), or a derivative of a compound represented by Formula (C), such as 2-aminoethanethiol derivative, 2-aminoethanol derivative, or 3-amino-1-propanol derivative.

Using any of the above compounds as the specific amine-based ligands enables the inter-dot distance to be regulated to less than 0.45 nm, and a high photocurrent value can be obtained as compared to a case in which ethanedithiol is used as ligands. In particular, using 2-aminoethanol or 2-aminoethane-1-thiol, which is represented by Formula (A), as ligands produces a large effect with respect to an increase in the photocurrent value.

It is conceivable that the reasons therefor are the following two reasons.

Specifically, a dangling bond of a metal atom in each semiconductor quantum dot, —NH$_2$ illustrated in Formula (A), and SH (or OH) illustrated as $X^1$ in Formula (A) form a five-membered cyclic chelate, and the formation of the five-membered cyclic chelate makes it easier to obtain a high complex stability constant (log β). Further, the chelate coordination of the specific amine-based ligands to the metal atom in each semiconductor quantum dot reduces the steric hindrance between semiconductor quantum dots, and, consequently, a high electrical conductivity can easily be obtained. The coordination mechanism as described above applies to the case of a derivative of a 2-aminoethanol or a derivative of 2-aminoethanethiol. Therefore, a high photocurrent value can be obtained, and a high electrical conductivity can be obtained, even in the case of using a derivative of 2-aminoethanol or a derivative of 2-aminoethanethiol.

When an alcohol is used as the second solvent contained in the ligand solution, the specific amine-based ligands preferably have a hydroxy group (OH) in a molecule thereof. When the specific amine-based ligands have a hydroxy group in the molecular structure thereof, miscibility thereof with alcohol can be improved, and efficient ligand exchange can be achieved.

The content of the specific amine-based ligands in the ligand solution is preferably from 5 mmol/l to 200 mmol/l, and more preferably from 10 mmol/l to 100 mmol/l, with respect to the total volume of the ligand solution.

(Second Solvent)

The second solvent contained in the ligand solution is not particularly limited. The second solvent is preferably a solvent that has high ability to dissolve the specific amine-based ligands.

Organic solvents having a high dielectric constant are preferable as such a solvent, and examples thereof include ethanol, acetone, methanol, acetonitrile, dimethylformamide, dimethylsulfoxide, butanol, and propanol.

The second solvent may be used singly, or may be a mixed solvent obtainable by mixing two or more solvents.

Among the solvents described above, the second solvent is preferably a solvent having a lower tendency to remain in the semiconductor film to be formed. In consideration of the ease of drying and ease of removal by washing, alcohols having a low boiling point or alkanes are preferable, and methanol, ethanol, n-hexane, or n-octane is more preferable.

It is preferable that the second solvent does not mix with the first solvent. For example, when an alkane such as hexane or octane is used as the first solvent, it is preferable to use a polar solvent such as methanol or acetone as the second solvent.

The content of the second solvent in the ligand solution is the remaining part left after subtracting the content of the specific amine-based ligands from the total mass of the ligand solution.

Methods that can be employed for applying the ligand solution to the cluster of semiconductor quantum dots are the same as the methods that can be employed for applying the semiconductor quantum dot dispersion liquid to the substrate, and preferred embodiments thereof are also the same.

The semiconductor quantum dot cluster formation process and the ligand exchange process may be performed repeatedly. Repeatedly performing the semiconductor quantum dot cluster formation process and the ligand exchange process can increase the electrical conductance of the semiconductor film having the cluster of semiconductor quantum dots to which the specific amine-based ligands coordinate, and enables the thickness of the semiconductor film to be increased.

Repeatedly performing the semiconductor quantum dot cluster formation process and the ligand exchange process may include performing the respective processes separately and independently; however, repeatedly performing the semiconductor quantum dot cluster formation process and the ligand exchange process preferably includes repeating a cycle in which the ligand exchange process is performed after the semiconductor quantum dot cluster formation process is performed. Repeating the semiconductor quantum dot cluster formation process and the ligand exchange process in sets makes it easier to suppress non-uniformity of ligand exchange.

In the case of repeatedly performing the semiconductor quantum dot cluster formation process and the ligand exchange process, it is preferable to perform sufficient drying of the film every cycle.

It is conceivable that the higher the ratio of replacement with the specific amine-based ligands during the ligand exchanging in the cluster of semiconductor quantum dots is, the higher the photocurrent value of the semiconductor film becomes.

Here, the ligand exchange between the first ligands and the second ligands (the specific amine-based ligands) in the semiconductor quantum dots may include ligand exchange in at least a portion of the cluster of semiconductor quantum dots, and it is not essential that 100% (in number) replacement by the specific amine-based ligands occur.

The method of manufacturing a semiconductor film according to the present embodiment may further include, for example, one or more selected from a dispersion liquid drying process of drying the semiconductor quantum dot dispersion liquid, a solution drying process of drying the ligand solution, or a washing process of washing the cluster of semiconductor quantum dots provided on the substrate.

Washing Process

The method of manufacturing a semiconductor film according to the invention may further include a washing process of washing the cluster of semiconductor quantum dots provided on the substrate.

When the washing process is included, excess ligands and ligands detached from the semiconductor quantum dots can be removed, and residual solvents and other impurities can also be removed. The washing of the cluster of semiconductor quantum dots may be performed by pouring at least one of the first solvent or the second solvent onto the cluster of semiconductor quantum dots, or by immersing a substrate having thereon the cluster of semiconductor quantum dots or the semiconductor film in at least one of the first solvent or the second solvent.

The washing by the washing process may be performed after the semiconductor quantum dot cluster formation process or after the ligand exchange process. The washing may be performed after the repetition of a set of processes composed of the semiconductor quantum dot cluster formation process and the ligand exchange process.

Drying Process

The method of manufacturing a semiconductor film according to the invention may include a drying process.

The drying process may be a dispersion liquid drying process of drying a solvent remaining in the cluster of semiconductor quantum dots after the semiconductor quantum dot cluster formation process, or a solution drying process of drying a ligand solution after the ligand exchange process. Further, the drying process may be a process of drying in a lump performed after the repetition of the set of processes composed of the semiconductor quantum dot cluster formation process and the ligand exchange process.

A semiconductor film is manufactured on a substrate through the processes described above.

In the semiconductor film obtained, semiconductor quantum dots are connected to each other with a specific amine-based ligand therebetween, the specific amine-based ligand being shorter than that of conventional art. As a result, the inter-dot distance in the semiconductor film is less than 0.45 nm, and the semiconductor film has a high electrical conductivity, whereby a high photocurrent value can be obtained. Since the complex stability constant of the specific amine-based ligand is high, the coordination bonds in the semiconductor film according to the invention formed from the semiconductor quantum dots and the specific amine-based ligands are stable, and the semiconductor film has excellent film strength and suppressed film detachment.

It is conceivable that the spacing between semiconductor quantum dots in the semiconductor film manufactured according to the present embodiment is short due to the formation of coordination bonding between the semiconductor quantum dots and the specific amine-based ligands having only a small number of atoms and represented by Formula (A), (B), or (C). It is conceivable that, as a result of the short spacing, the semiconductor quantum dots are arranged densely, and the overlapping of wave functions between semiconductor quantum dots can increase. It is conceivable that, as a result of this, the electrical conductivity increases, and the photocurrent value increases.

The specific amine-based ligands include, in its molecule: at least one amino group ($NH_2$); and —SH, —$NH_2$, or —OH represented by $X^1$ (or $X^2$) or OH of the carboxy group. An amino group has a high complex stability constant, and it is conceivable that an amino group promotes formation of a complex between the metal atom of each semiconductor quantum dot and —SH, —$NH_2$, or —OH represented by $X^1$ (or $X^2$) or OH of the carboxy group. It is conceivable that the promoted complex formation makes stronger the bonding between semiconductor quantum dots and the specific amine-based ligands, and, therefore, suppresses the detachment of the semiconductor film that includes the semiconductor quantum dots and the specific amine-based ligands.

It is conceivable that, for the reasons discussed above, using the semiconductor film according to the invention enables obtainment of a high photocurrent value and suppression of film detachment.

In the semiconductor film of the present embodiment, the complex stability constant log $\beta_1$ between the specific amine-based ligand and the metal atom of each semiconductor quantum dot is preferably 8 or greater.

Here, the complex stability constant is determined by the relationship between the ligand and the metal atom with which the ligand forms a coordination bond, and the complex stability constant is represented by the following Formula (b).

$$\log \beta_1 = \frac{[ML]}{[M][L]} \quad \text{Formula (b)}$$

In Formula (b), [ML] represents the molar concentration of the complex formed by the bonding between the metal atom and the ligand, [M] represents the molar concentration of metal atoms that can participate in the coordination bonding, and [L] represents the molar concentration of the ligand.

There are actually cases where plural ligands coordinate to one metal atom. Nevertheless, in the present embodiment, the complex stability constant log $\beta_1$ represented by Formula (b) corresponding to a case where one ligand molecule coordinates to one metal atom is determined as an index of the strength of coordination bonding.

When the complex stability constant log $\beta_1$ between the specific amine-based ligand and the metal atom of each semiconductor quantum dot is 8 or greater, a complex easily forms.

A higher complex stability constant log $\beta_1$ of the combination of the semiconductor quantum dot and the ligand is more preferable. Further, the bonding strength increases when the ligand is capable of multidentate coordination, as in the case of chelates. In general, a stronger coordination bonding enables conventional long molecular chain ligands to be more efficiently replaced, and enables a higher electrical conductivity to be more easily obtained. The value of the complex stability constant log $\beta_1$ of the specific amine-based ligand varies depending on what semiconductor quantum dot material is used for constituting the semiconductor quantum dots. Nonetheless, the specific amine-based ligand can be applied to various semiconductor quantum dot materials since the specific amine-based ligand has a short molecular chain length and can easily coordinate.

The log $\beta_1$ is more preferably 8 or more, and still more preferably 10 or more.

The complex stability constant log $\beta_1$ between the specific amine-based ligand and the metal atom of each semiconductor quantum dot in the semiconductor film of the present embodiment may be obtained using, for example, spectroscopy, magnetic resonance spectroscopy, potentiometry, solubility measurement, chromatography, calorimetry, freezing point measurement, vapor pressure measurement, relaxation measurement, viscosity measurement, or surface tension measurement.

In the present embodiment, the complex stability constant is obtained using Sc-Database ver. 5.85 (Academic Software) (2010) in which various methods and results reported from research institutions are collected. In a case in which a log $\beta_1$ value is not included in Sc-Database ver. 5.85, a value described in "Critical Stability Constants" (A. E. Martell and R. M. Smith) is used. In a case in which the log $\beta_1$ value is not described in "Critical Stability Constants" either, the log $\beta$ value is calculated using the measurement method described above or using a program PKAS method for calculating the complex stability constant (A. E. Martell, et al., The Determination and Use of Stability Constants, VCH (1988)).

(2) Second Embodiment

The semiconductor film according to the invention can also be obtained by adding, for example, a ligand agent that includes at least a thiocyan group and a metal ion (also referred to as a specific thiocyan-based ligand agent) to the cluster of semiconductor quantum dots. The ligand agent is a compound having a ligand. In the case of using the specific thiocyan-based ligand agent, at least a thiocyan group serves as a ligand and coordinates to a semiconductor quantum dot. The metal ion may additionally coordinate to a semiconductor quantum dot.

It is thought that, in general organic ligands (for example, ethanedithiol), a ligand group (such as SH, $NH_2$, and OH) coordinates to only a cation portion of a quantum dot surface. It is presumed that using such general organic ligands results in an increased amount of dangling bonds as compared to the case of using the specific ligand agent containing a thiocyan group, since the ligand groups in the general organic ligands have a longer molecular chain length than that of a thiocyan group.

Meanwhile, the specific thiocyan-based ligand agent has at least a thiocyan group and a metal atom.

Examples of general ligands having a thiocyan group include tetrabutylammonium thiocyanate (TBAT). When TBAT is used as a ligand agent, a sufficient electrical conductivity is not obtained. The reason therefor is presumably that the molecular chain of TBAT is long and the tetrabutylammonium ion portion having a large molecular weight remains in the semiconductor film, as a result of which the electrical conduction through the semiconductor quantum dots is inhibited.

As described above, a thiocyan group has a short molecular chain length and has an S atom and an N atom that easily form a coordination bond with semiconductor quantum dots; it is conceivable that the thiocyan group therefore firmly coordinates to a semiconductor quantum dot and decreases the distance between particles, thereby enhancing the strength of the semiconductor film and suppressing film detachment of the semiconductor film.

Thiocyan Group and Metal Ion (Specific Thiocyan-based ligand Agent)

The semiconductor film of the present embodiment includes a thiocyan group and a metal ion.

The origins of the thiocyan group and the metal ion constituting the semiconductor of the present embodiment are not particularly limited. The metal ion may be a monovalent metal ion, or a di- or higher-valent metal ion. Further, the metal ion may be an alkali metal ion, an alkaline earth metal ion, or a transition metal ion. Among them, the metal ion is preferably an alkali metal ion, and the metal ion is preferably a potassium ion or a lithium ion.

The semiconductor film of the present embodiment may include only one kind of metal ion or a mixture of two or more kinds of metal ions.

The semiconductor film of the present embodiment can be obtained by adding, for example, a ligand agent that includes at least a thiocyan group and a metal ion (specific thiocyan-based ligand agent) to the cluster of semiconductor quantum dots.

Examples of the ligand agent (specific thiocyan-based ligand agent) containing at least a thiocyan group and a metal ion include potassium thiocyanate, barium thiocyanate, mercury bisthiocyanate, calcium thiocyanate, cadmium thiocyanate, copper thiocyanate, lithium thiocyanate, silver thiocyanate, cobalt thiocyanate, lead bisthiocyanate, nickel thiocyanate, sodium thiocyanate, zinc thiocyanate, thallium thiocyanate, strontium thiocyanate, sodium tris(thiocyanate), iron bis(thiocyanate), iron tris(thiocyanate), manganese bisthiocyanate, oxozirconium bis(thiocyanate), and oxohafnium bis(thiocyanate).

The semiconductor film of the present embodiment includes at least the cluster of the semiconductor quantum dots containing the metal atom, a thiocyan group, and a metal ion, and at least the thiocyan group coordinates to the semiconductor quantum dots. Due to the semiconductor film having such a configuration, a high photocurrent value can be obtained, and film detachment is suppressed.

The S atom and the N atom in a thiocyan group that coordinates to a semiconductor quantum dot have a high tendency to form a coordination bond with a cation portion of the semiconductor quantum dot, and, at the same time, the metal atom has a high tendency to form a coordination bond with an anion portion of the semiconductor quantum dot. It is conceivable that dangling bond of both the cation portion and the anion portion is consequently reduced, and, due to the reduction in defects, overlapping of wave functions between semiconductor quantum dots can be enhanced. It is conceivable that a high electrical conductivity can resultantly be obtained.

The method of manufacturing a semiconductor film according to the present embodiment using the specific thiocyan-based ligand agent includes:

a semiconductor quantum dot cluster formation process of applying a semiconductor quantum dot dispersion liquid, to form a cluster of semiconductor quantum dots, the semiconductor quantum dot dispersion liquid including semiconductor quantum dots containing a metal atom, first ligands coordinating to respective semiconductor quantum dots, and a first solvent; and a ligand exchange process of applying, to the cluster, a ligand agent solution and replacing the first ligands, which coordinate to the semiconductor quantum dots, by a second ligand agent, the ligand agent solution including the second ligand agent (specific thiocyan-based ligand agent) and a second solvent, and the second ligand agent being shorter than the first ligand and including a thiocyan group and a metal ion.

Semiconductor Quantum Dot Cluster Formation Process

The semiconductor quantum dot cluster formation process is the same as that in the first embodiment, and description thereof is omitted.

The second ligand agent (specific thiocyan-based ligand agent) is a compound having a thiocyan group and a metal ion, as described above. When the second ligand agent has coordinated to a semiconductor quantum dot, the second ligand agent is difficult to disperse in organic solvents.

Ligand Exchange Process

In the ligand exchange process, a ligand agent solution that includes a second solvent and the second ligand agent (specific thiocyan-based ligand agent) having a shorter molecular chain length than that of the first ligands and having a thiocyan group and a metal ion is applied to the cluster of semiconductor quantum dots that has been formed on the substrate through the semiconductor quantum dot cluster formation process, and the first ligands coordinating to respective semiconductor quantum dots are replaced by the second ligands contained in the ligand agent solution.

Ligand Agent Solution

The ligand agent solution includes at least the second ligand agent (specific thiocyan-based ligand agent) and the second solvent.

The ligand agent solution may further include other components as far as the effects of the invention are not impaired.

(Second Ligand Agent)

The second ligand agent is the specific thiocyan-based ligand agent described above, and has a molecular chain length shorter than that of the first ligands. The method employed for determining whether or not the length of the molecular chains of the ligands is longer or shorter is the same as that described in the description of the first ligands in the first embodiment, in which the specific amine-based ligands are used.

The details of the specific thiocyan-based ligand agent are also the same as those described above.

The content of the specific thiocyan-based ligand agent in the ligand agent solution is preferably from 5 mmol/l to 200 mmol/l, and more preferably from 10 mmol/l to 100 mmol/l, with respect to the total volume of the ligand agent solution.

(Second Solvent)

The second solvent contained in the ligand agent solution is not particularly limited, and the second solvent is preferably a solvent that easily dissolves the specific thiocyan-based ligand agent.

Organic solvents having a high dielectric constant are preferable as such a solvent, and examples thereof include ethanol, acetone, methanol, acetonitrile, dimethylformamide, dimethylsulfoxide, butanol, and propanol.

The second solvent may be used singly, or may be a mixed solvent obtainable by mixing two or more solvents.

The second solvent is preferably a solvent that has a lower tendency to remain in the formed semiconductor film, among the solvents described above. From the viewpoints of ease of drying and ease of removal by washing, alcohol having low boiling points and alkanes are preferable, and methanol, ethanol, n-hexane, or n-octane is more preferable.

It is preferable that the second solvent does not mix with the first solvent. For example, when an alkane such as hexane or octane is used as the first solvent, a polar solvent such as methanol or acetone is preferably used as the second solvent.

The content of the second solvent in the ligand agent solution is the remaining part left after subtracting the content of the specific thiocyan-based ligand agent from the total mass of the ligand agent solution.

Methods that can be employed for applying the ligand agent solution to the cluster of semiconductor quantum dots are the same as the methods that can be employed for applying the semiconductor quantum dot dispersion liquid onto the substrate, and preferred embodiments thereof are also the same.

When the first ligands are replaced by the second ligand agent (specific thiocyan-based ligand agent), at least a thocyan group from among the constituent elements of the specific thiocyan-based ligand agent coordinates to the metal atom of a semiconductor quantum dot. Specifically, coordination to the metal atom of the semiconductor quantum dot occurs via at least one of the S atom or the N atom of the thiocyan group consisting of three atoms. It is conceivable that the thiocyan-based ligand agent, in which the size of the ligand is as small as three atoms, has a high ability to diffuse into the semiconductor film as compared with the case of coordination of ligands having a long molecular chain, thereby enabling efficient ligand exchange. The metal ion therein may coordinate to the metal ion of a semiconductor quantum dot, may be diffusely present as a counter ion for the thiocyan group rather than performing coordination, or may be present as a free ion.

Through the ligand exchange process, the first ligands coordinating to the semiconductor quantum dots and having a molecular chain length longer than that of the second ligand agent is replaced by the second ligand agent by applying the solution containing the specific thiocyan-based ligand agent to the cluster of semiconductor quantum dots. Here, the second ligand agent contains at least a thiocyan group and a metal ion, and is the specific thiocyan-based ligand agent described above.

As a result of the ligand exchange, the thiocyan group in the specific thiocyan-based ligand agent coordinates to at least the metal atom of a semiconductor quantum dot.

It is conceivable that, through the ligand exchange process, the thiocyan group in the second ligand agent (specific thiocyan-based ligand agent) having a molecular chain length shorter than that of the first ligands coordinates to each semiconductor quantum dot, instead of the first ligands, to form a coordination bond with the semiconductor quantum dot, as a result of which the semiconductor quantum dots can easily come close to each other. Due to the semiconductor quantum dots coming closer to each other, the inter-dot distance is regulated to be less than 0.45 nm, and the electrical conductivity of the cluster of semiconductor quantum dots is enhanced, whereby a semiconductor film having a high photocurrent value can be obtained.

Also in the present embodiment, the semiconductor quantum dot cluster formation process and the ligand exchange process may repeatedly be performed. Repeatedly performing the semiconductor quantum dot cluster formation process and the ligand exchange process enables the semiconductor film having the cluster of semiconductor quantum dots coordinated with the specific thiocyan-based ligand agent to have an increased electric conductivity and also enables the thickness of the semiconductor film to be increased.

Repeatedly performing the semiconductor quantum dot cluster formation process and the ligand exchange process may include performing the respective processes separately and independently, but preferably includes repeatedly performing a cycle in which the ligand exchange process is performed after the semiconductor quantum dot cluster formation process is performed. Repeatedly performing the set of processes composed of the semiconductor quantum dot cluster formation process and the ligand exchange process makes it easier to suppress non-uniformity of ligand exchange.

In the case of repeatedly performing the semiconductor quantum dot cluster formation process and the ligand exchange process, it is preferable to perform sufficient drying of the film every cycle.

It is conceivable that the higher the ratio of replacement with the specific thiocyan-based ligand agent during the ligand exchanging in the cluster of semiconductor quantum dots is, the higher the photocurrent value of the semiconductor film becomes.

Here, the ligand exchange between the first ligands and the second ligands (the specific thiocyan-based ligand agent) in the semiconductor quantum dots may include ligand exchange in at least a portion of the cluster of semiconductor quantum dots, and it is not essential that 100% (in number) replacement by the specific thiocyan-based ligand agent occur.

<Electronic Device>

The uses of the semiconductor film according to the invention are not limited. Since the semiconductor film according to the invention has photoelectric conversion characteristics and the detachment thereof is suppressed, the semiconductor film according to the invention can suitably be applied to various electronic devices having a semiconductor film or a photoelectric conversion film.

Specifically, the semiconductor film according to the invention can suitably be applied to a photoelectric conversion film of a solar cell, a light-emitting diode (LED), a semiconductor layer (active layer) of a thin film transistor, a photoelectric conversion film of an indirect radiation imaging apparatus, a visible to infrared photodetector, and the like.

<Solar Cell>

A solar cell is described below as one example of an electronic device that includes the semiconductor film according to the invention or the semiconductor film manufactured by the method of manufacturing a semiconductor film according to the invention.

For example, a p-n junction solar cell can be configured using a semiconductor film device that has a p-n junction and that includes a p-type semiconductor layer including the semiconductor film according to the invention and an n-type semiconductor layer.

Examples of more specific embodiments of the p-n junction solar cell include an embodiment in which a p-type semiconductor layer and an n-type semiconductor layer are provided adjacent to each other on a transparent conductive film formed on a transparent substrate, and in which a metal electrode is formed on the p-type semiconductor layer and the n-type semiconductor layer.

One example of the p-n junction solar cell is described below with reference to FIG. 1.

FIG. 1 is a schematic cross-sectional view of a p-n junction solar cell 100 according to an embodiment of the invention. The p-n junction solar cell 100 has a layered structure that includes a transparent substrate 10, a transparent conductive film 12 provided on the transparent substrate 10, a p-type semiconductor layer 14 provided on the transparent conductive film 12 and configured by the semiconductor film according to the invention, an n-type semiconductor layer 16 provided on the p-type semiconductor layer 14, and a metal electrode 18 provided on the n-type semiconductor layer 16.

The p-n junction solar cell can be obtained due to the p-type semiconductor layer 14 and the n-type semiconductor layer 16 disposed as adjacent layers.

Examples of materials that can be used as the transparent substrate 10 are the same as those of the materials that can be used as the substrate for use in the method of manufacturing a semiconductor film according to the invention, provided that the substrate is transparent. Specific examples thereof include glass substrates and resin substrates.

Examples of the transparent conductive film 12 include a film formed from a $In_2O_3$:Sn (ITO), $SnO_2$:Sb, $SnO_2$:F, ZnO:Al, ZnO:F, $CdSnO_4$, or the like.

As the p-type semiconductor layer 14, the semiconductor film according to the invention is used, as described above, The n-type semiconductor layer 16 is preferably a metal oxide. Specific examples thereof include a metal oxide containing at least one of Ti, Zn, Sn, or In, and more specific examples include $TiO_2$, ZnO, $SnO_2$, and IGZO. From the viewpoint of manufacturing cost, the n-type semiconductor layer is preferably formed using a wet process (also referred to as a liquid phase method), similar to the case of the p-type semiconductor layer.

As the metal electrode 18, Pt, Al, Cu, Ti, Ni, or the like may be used.

EXAMPLES

Examples are described below. However, the examples should not be construed as limiting the invention.

Preparation of Semiconductor Quantum Dot Dispersion Liquid 1

First, a PbS particle dispersion liquid in which PbS particles are dispersed in toluene was prepared. The PbS particle dispersion liquid used was PbS CORE EVIDOT (nominal particle diameter: 3.3 nm, concentration: 20 mg/ml, solvent:toluene) manufactured by Evident Technologies, Inc.

Subsequently, 2 ml of the PbS particle dispersion liquid was added into a centrifuge tube, 38 µl of oleic acid was added thereto, and 20 ml of toluene was further added thereto, thereby decreasing the concentration of the dispersion liquid. Thereafter, the PbS particle dispersion liquid was subject to ultrasonic dispersing treatment, and the PbS particle dispersion liquid was agitated well. Then, 40 ml of ethanol was added to the PbS particle dispersion liquid, and ultrasonic dispersing treatment was further carried out, and centrifugal separation was carried out at 10000 rpm and 3° C. for 10 minutes. The supernatant in the centrifuge tube was discarded, 20 ml of octane was added into the centrifuge tube, and ultrasonic dispersing treatment was performed, thereby dispersing precipitated quantum dots in the octane solvent well. The resultant dispersion was subjected to concentration using a rotary evaporator (35 hpa, 40° C.), as a result of which about 4 ml of semiconductor quantum dot dispersion liquid 1 (solvent:octane) having a concentration of about 10 mg/ml was obtained.

The particle diameters of the PbS particles contained in semiconductor quantum dot dispersion liquid 1 were measured using STEM (scanning transmission electron microscope), and analyzed with an image checking software, whereby the average particle diameter of the PbS particles contained in the semiconductor quantum dot dispersion liquid 1 was found to be 3.2 nm.

Preparation of Semiconductor Quantum Dot Dispersion Liquid 2

30 ml of 1-octadecene, 6.32 mmol of lead oxide (II), and 21.2 mmol of oleic acid were individually weighed, and mixed in a three-necked flask. The mixture was stirred at 300 rpm using a magnetic stirrer of an aluminum block hot plate stirrer. During stirring of the mixture, the mixture was deaerated and dehydrated at 120° C. for 1 hour under reduced pressure. Subsequently, the three-necked flask was cooled to room temperature using a cooling fan, and ventilation with a nitrogen gas was carried out. Then, a solution containing 2.57 mmol of hexamethyldisilathiane and 5 ml of 1-octadecene was injected into the three-necked flask using a syringe (allowing a syringe needle to penetrate through a septum cap). Thereafter, the three-necked flask was heated to 120° C. over 40 minutes, and maintained at that temperature for 1 minute. Then, the three-necked flask was cooled to the room temperature using a cooling fan. Undesired matter was removed from the resultant product using a centrifuge, thereby separating only PbS particles. The particles were dispersed in octane. When the undesired matter was removed from the product, toluene was used as a good solvent, and dehydrated ethanol was used as a poor solvent.

As a result of observation under a STEM, it was found that the average particle diameter of the obtained PbS was 5 nm.

This octane dispersion liquid of PbS quantum dots was diluted with hexane solvent to obtain semiconductor quantum dot dispersion liquid 2 (a mixed solvent of octane and hexane in a volume ratio of 1:9 (octane:hexane)) having a concentration of about 10 mg/ml.

Preparation of Ligand Solution 1 mmol of the ligand indicated in the column "ligand" in Table 1 was prepared, and dissolved in 10 ml of methanol, to prepare a ligand solution having a concentration of 0.1 mol/l. Ultrasonic waves are applied thereto in order to promote the dissolution of the ligand in the ligand solution, thereby avoiding occurrence of residual undissolved ligand as much as possible.

<Measurement of Average Shortest Inter-Dot Distance Between Semiconductor Quantum Dots in Semiconductor Film>

First, quantum dot films (samples) of Examples 1 to 3 and Comparative Examples 1 and 2 were manufactured as follows.

Preparation of Semiconductor Film

First, a hexamethyldisilazane solution was spin-coated on quartz glass, thereby hydrophobizing the surface. Thereafter, a semiconductor film having a cluster of semiconductor quantum dots was prepared according to the following procedures.

(I) Semiconductor Quantum Dot Cluster Formation Process

Semiconductor quantum dot dispersion liquid 2 prepared was drop-casted on a substrate, to obtain a semiconductor quantum dot cluster film.

(II) Ligand Exchange Process

Further, the semiconductor quantum dot cluster film was immersed in a methanol solution of the ligand indicated in Table 1 for 3 minutes, thereby performing treatment for replacing oleic acid as the first ligand by the ligand indicated in Table 1. In this manner, the quantum dot films of Examples and Comparative Examples were obtained.

(III) Washing Process i

Subsequently, each quantum dot film was immersed in methanol solvent.

(IV) Washing Process ii

Further, each quantum dot film after washing in the washing process i was immersed in octane solvent.

A series of processes (I) to (IV) was repeated for two cycles, to obtain a ligand-exchanged semiconductor film formed of a cluster of PbS quantum dots and having a thickness of 20 nm.

In Comparative Example 2, the semiconductor quantum dot cluster film at the time of completion of (I) semiconductor quantum dot cluster formation process was used.

The quantum dot films (samples) of Examples 1 to 3 and Comparative Examples 1 and 2 obtained were subjected to structure evaluation using a grazing incidence small angle X-ray scattering method (GISAXS). A Kα line of Cu was used as incident light, the quantum dot film was irradiated with the X rays at an incident angle (approximately 0.4°) that is slightly larger than the critical angle for total reflection, and scattered light was detected by moving a detector in a scanning manner in an in-plane direction.

The in-plane angle dependence of the scattered light left after subtracting a scattered light background structure for the respective ligand species is indicated in FIG. 2F, with respect to each of the semiconductor films of Examples 1 to 3 and Comparative Example 1.

Figure 2:
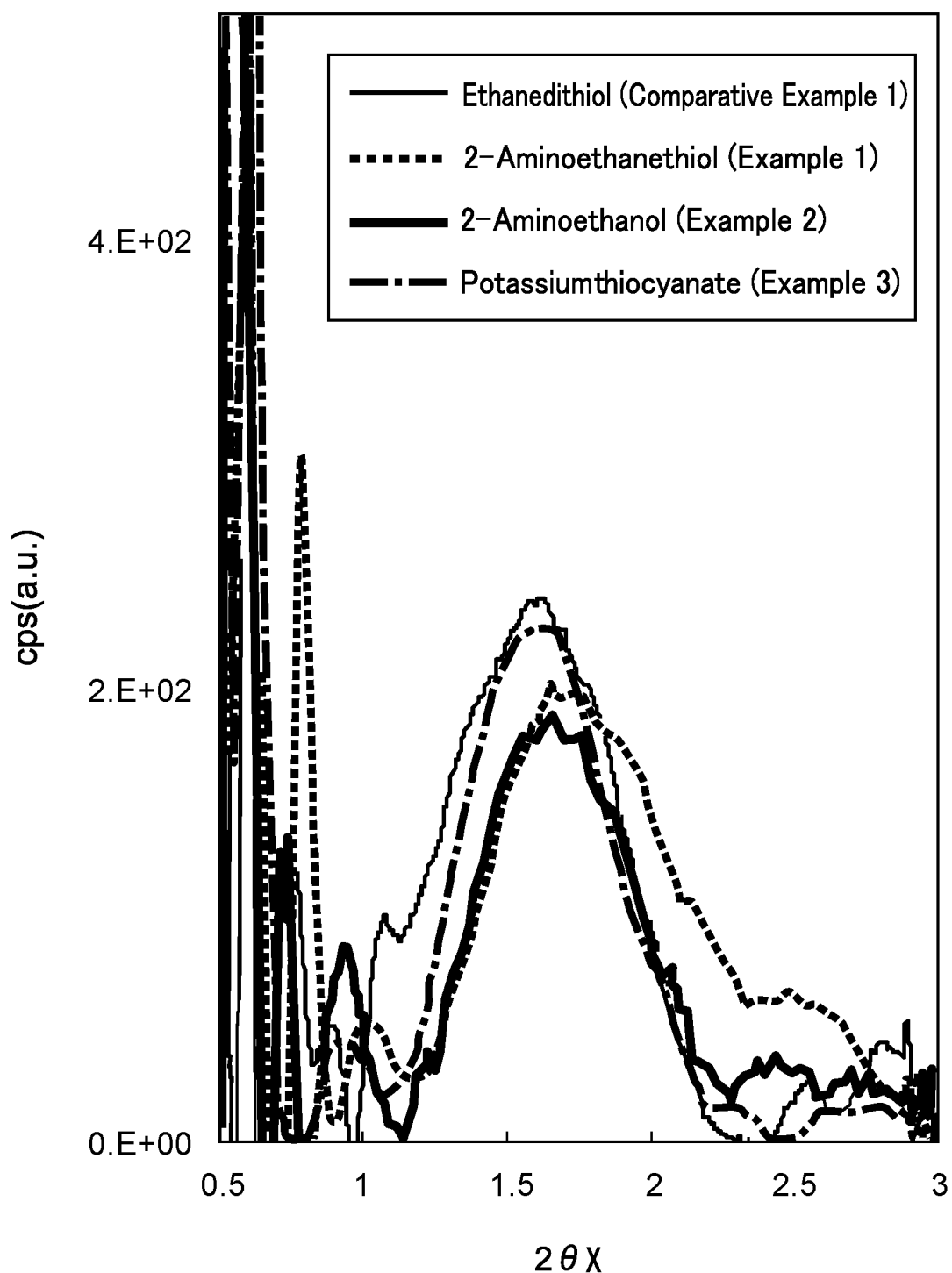
FIG. 2 is a view illustrating an in-plane angle dependency of scattered light in grazing incidence small angle X-ray scattering measurements of the semiconductor films manufactured in Examples and Comparative Examples.

Scatter peaks that reflect the in-plane periodic structure were obtained for all of the samples, as illustrated in FIG. 2 for Examples 1 to 3 and Comparative Example 1, and also for Comparative Example 2 although not illustrated in the drawings. When a scatter peak position obtained is represented by $\theta_{MAX}$, the center-to-center distance d between semiconductor quantum dots in the sample is calculated based on the following Equation (D):

$$d = \lambda/2 \sin \theta_{MAX} \quad \text{(D)}$$

In Equation (D), $\lambda$ represents the wavelength of the incident light.

Table 1 indicates the shortest of the distances between adjacent quantum dots calculated from the scattering peaks (after subtraction of the particle diameter of the quantum dot from the measured center-to-center distance d between the quantum dots). The detected scattered light was an average of scattered X rays from all of the regions of the sample that were irradiated with X rays in the measuring instrument.

TABLE 1

| | Ligand | Distance between quantum dots |
|---|---|---|
| Example 1 | 2-aminoethane-1-thiol | 0.14 nm |
| Example 2 | 2-aminoethanol | 0.29 nm |
| Example 3 | potassium thiocyanate | 0.42 nm |
| Comparative Example 1 | ethanedithiol | 0.45 nm |
| Comparative Example 2 | oleic acid (untreated) | 1.31 nm |

From Table 1, it is understood that the spacing between quantum dots (distance between quantum dots) was decreased in each of the films in which oleic acid as initial ligands (first ligands) were subjected to the ligand exchange treatment. In particular, in the films in which the ligands were replaced by 2-aminoethane-1-thiol, 2-aminoethanol, or potassium thiocyanate, the inter-dot distance was less than 0.45 nm, and it was confirmed that the proximity between semiconductor quantum dots in these films was even closer than that in conventional ethanedithiol coordination films.

<Evaluation of Electrical Conduction Property and Photocurrent Value>

Manufacture of Semiconductor Film

Figure 3:
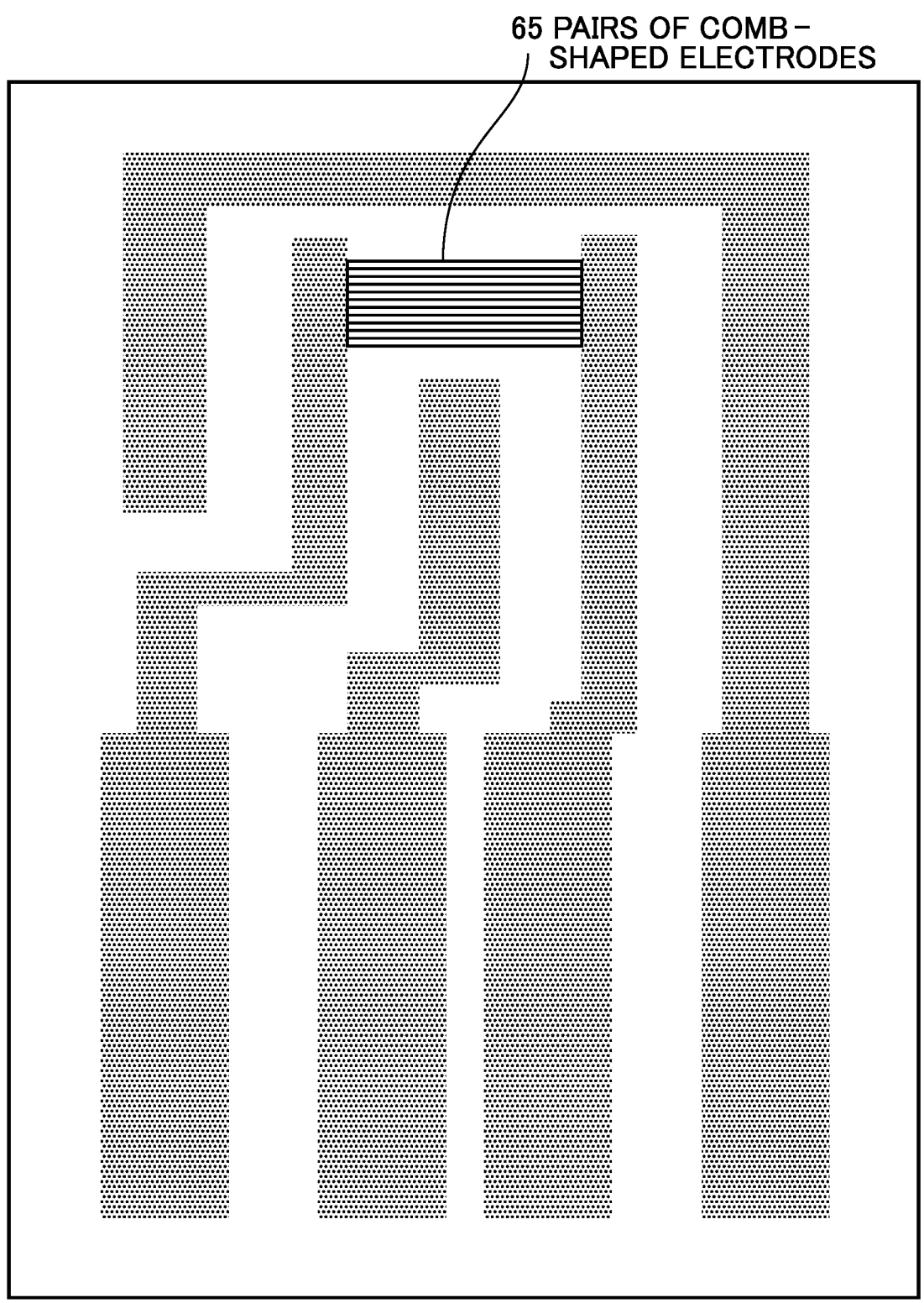
FIG. 3 is a schematic view illustrating a comb-shaped electrode substrate used in Examples.

As a substrate on which a semiconductor film formed of a cluster of semiconductor dot particles is to be formed, a substrate having 65 pairs of comb-shaped platinum electrodes illustrated in FIG. 3 on quartz glass was prepared. The comb-shaped platinum electrodes used were comb-shaped electrodes manufactured by BAS Inc. (model number: 012126, distance between electrodes: 5 μm). A semiconductor film was formed thereon according to the following operations.

(1) Semiconductor Quantum Dot Cluster Formation Process

Semiconductor quantum dot dispersion liquid 1 prepared was dropped on the substrate, and, thereafter, spin-coated at 2500 rpm, as a result of which a semiconductor quantum dot cluster film was obtained.

(2) Ligand Exchange Process

Further, a methanol solution of the ligand indicated in Table 2 (ligand solution) was dropped on the semiconductor quantum dot cluster film, and, thereafter, spin-coated at 2500 rpm, as a result of which a semiconductor film was obtained.

(3) Washing Process 1

Subsequently, methanol, which is the solvent of the ligand solution, was dropped alone on the semiconductor film, and spin-coated.

(4) Washing Process 2

Further, octane solvent was dropped alone on the semiconductor film after washing in the washing process 1, and the octane solvent was spin-coated.

A series of processes (1) to (4) was repeated for 15 cycles, to obtain a ligand-exchanged semiconductor film formed of a cluster of PbS quantum dots and having a thickness of 100 nm.

In this manner, a semiconductor film device having a semiconductor film on a substrate was manufactured.

The semiconductor film of the obtained semiconductor film device was subjected to the following evaluations.

1. Electrical Conductivity

The semiconductor film device prepared was subjected to evaluation of the electrical conductivity of the semiconductor film, using a semiconductor parameter analyzer.

First, a voltage applied between electrodes was swept between −5 V and 5 V in the state in which the semiconductor film device was not irradiated with light, and I-V characteristics in the dark state were obtained. The current value in the state in which a bias of +5V was applied was taken as a dark current value Id.

Figure 4:
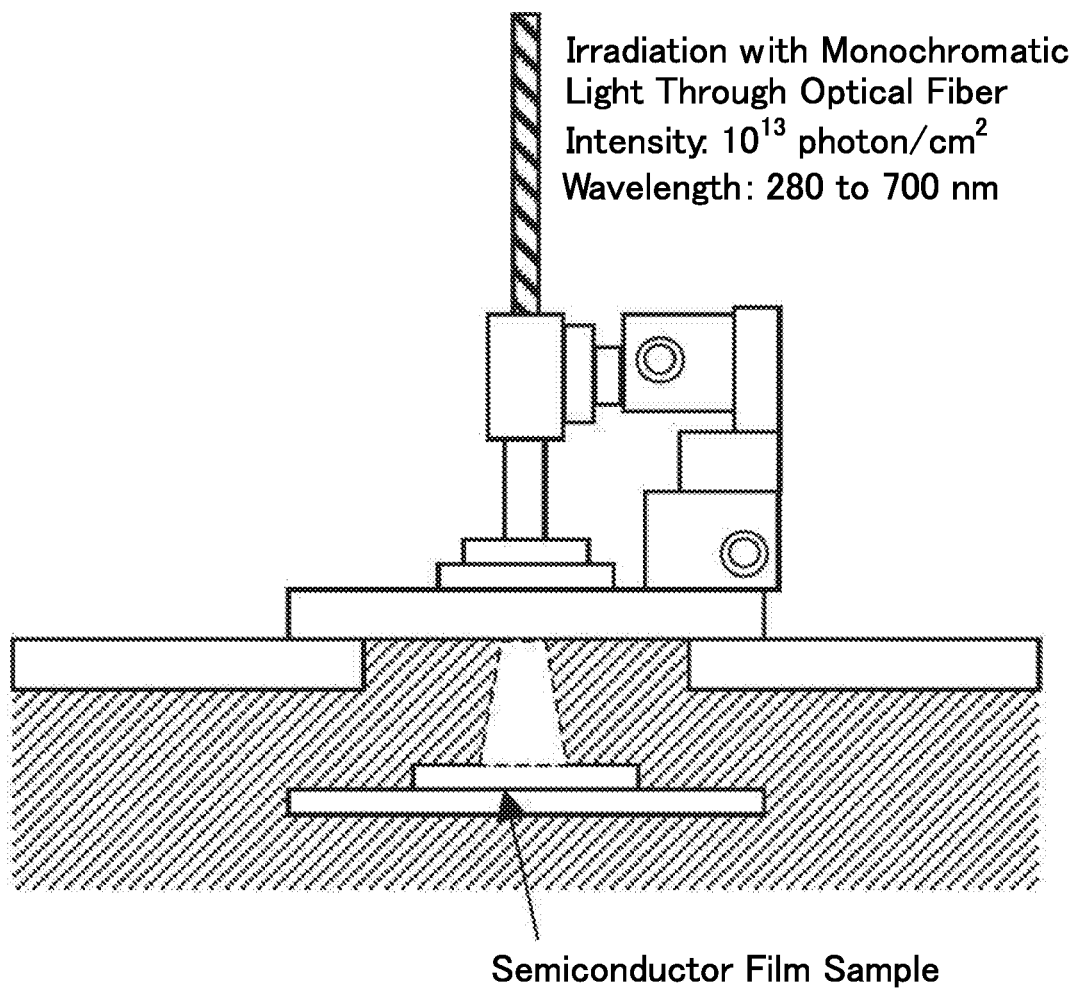
FIG. 4 is a schematic view illustrating a method of irradiating the semiconductor film manufactured in Examples with a monochromic light.

Then, a photocurrent value was evaluated in the state in which the semiconductor film device was irradiated with a monochromatic light (at an irradiation intensity of $10^{13}$ photons). The irradiation of the semiconductor film device with the monochromatic light was performed using an apparatus illustrated in FIG. 4. The wavelength of the monochromatic light was systematically changed between 280 nm and 700 nm. The increase in current observed under irradiation with a light having a wavelength of 280 nm as compared to the dark current value was taken as a photocurrent value Ip.

The evaluation results are indicated in Table 2.

2. Film Detachment from Substrate

Film detachment of the semiconductor film was visually evaluated with respect to the semiconductor film devices of Examples and Comparative Examples. Table 2 indicates whether or not film detachment was observed.

TABLE 2

| | Ligand for exchange | Photocurrent value Ip (A) | Dark current value Id (A) | Presence or absence of film detachment |
|---|---|---|---|---|
| Example 4 | 2-aminoethane-1-thiol | $7.28 \times 10^{-5}$ | $2.01 \times 10^{-3}$ | Absent |
| Example 5 | 2-aminoethanol | $2.99 \times 10^{-5}$ | $1.47 \times 10^{-4}$ | Absent |
| Example 6 | potassium thiocyanate | $5.29 \times 10^{-5}$ | $3.10 \times 10^{-4}$ | Absent |
| Comparative Example 3 | ethanedithiol | $1.13 \times 10^{-5}$ | $5.31 \times 10^{-5}$ | Present |
| Comparative Example 4 | oleic acid (untreated) | measurement was impossible | $1.42 \times 10^{-12}$ | Absent |

As indicated in Table 2, it was found that decreasing the inter-dot distance enabled obtainment of a high photocurrent value/dark current value as compared to the semiconductor film modified with ethanedithiol (Comparative Example 3). Further, significant film detachment could be observed with the naked eye in the case of the semiconductor film modified with ethanedithiol, whereas film detachment was not observed and high roughness was realized in the case of the ligands employed in Examples.

Figure 5:
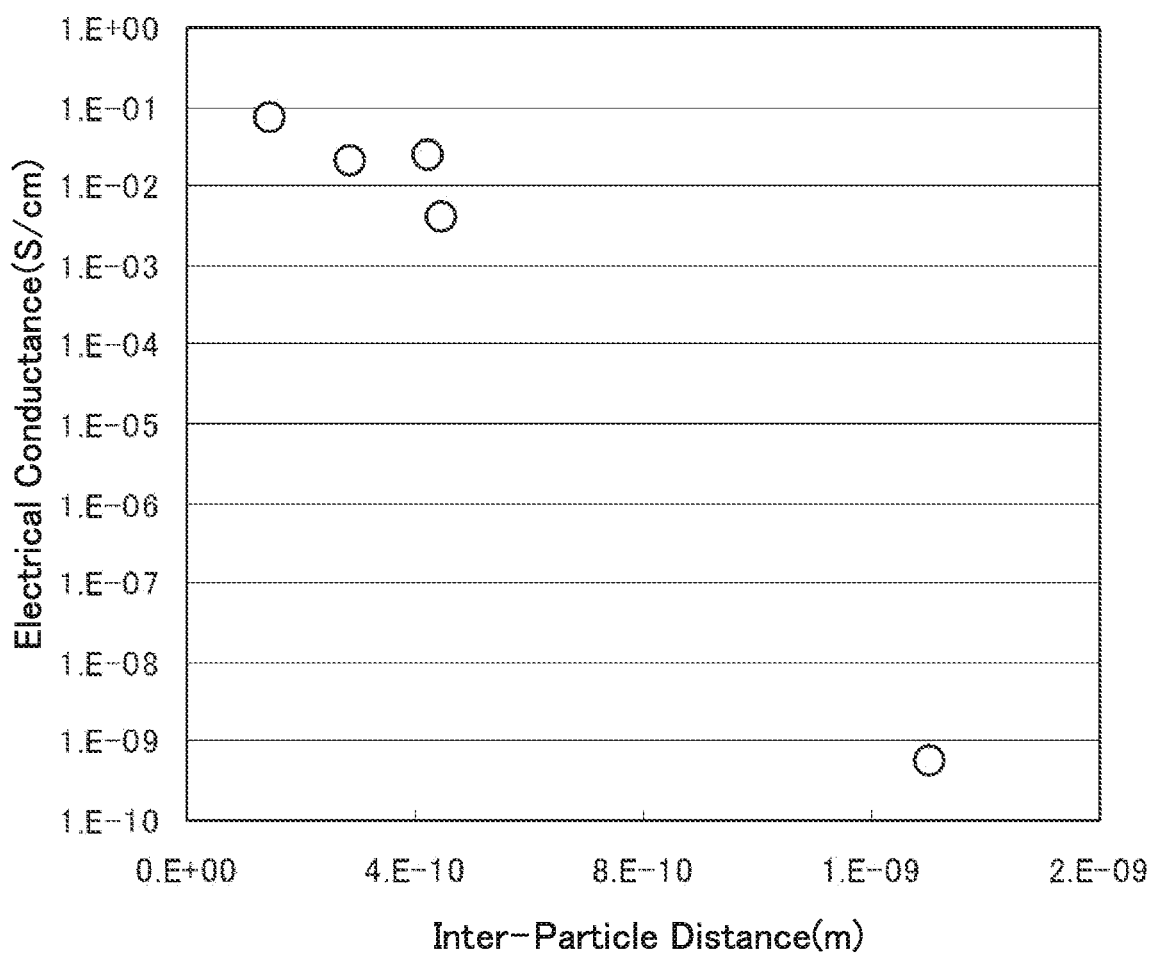
FIG. 5 is a view illustrating a relationship between a distance between semiconductor quantum dot particles and an electrical conductance measured in Examples.

On the bases of the results of the Examples and the Comparative Examples described above, FIG. 5 illustrates the relationship between the distance between semiconductor quantum dot particles and the electrical conductance. Since the inter-dot distance in the semiconductor quantum dots does not depend on the particle diameters of the semiconductor quantum dots but depends on the ligands coordinating to semiconductor quantum dots, the inter-dot distance is based on the values obtained by measurements in Examples 1 to 3 and Comparative Examples 1 and 2.

The electrical conductivity obtained in the case of ligand exchange using potassium thiocyanate (having an average inter-dot distance of 0.42 nm) is enhanced as compared to the electrical conductivity obtained in the case of ligand exchange using 2-aminoethanol (having an average inter-dot distance of 0.29 nm). The reason therefor is not clear. However, it is conceivable that, in the case of potassium thiocyanate, although the average inter-dot distance is relatively large, there are regions where the inter-dot distance is locally small, and an electrical conductive property slightly higher than the value expectable from the value of the average inter-dot distance was obtained due to the regions acting as main conduction paths.

However, the results indicated above basically indicate that quantum dot semiconductor films having a smaller average inter-dot distance can realize a higher electrical conductive property, and that, in order to reliably obtain a high electrical conductive property regardless of the coordination form of the ligand, the average inter-dot distance is preferably less than 0.3 nm, and more preferably less than 0.2 nm as in the coordination with 2-aminoethanethiol.

The disclosure of Japanese Patent Application No. 2012-283030, filed Dec. 26, 2012, is incorporated herein by reference in its entirety. All publications, patent applications, and technical standards mentioned in this specification are herein incorporated by reference to the same extent as if each individual publication, patent application, or technical standard was specifically and individually indicated to be incorporated by reference.

The invention claimed is:

1. A method of manufacturing a semiconductor film, the method comprising:
   a semiconductor quantum dot cluster formation process of applying a semiconductor quantum dot dispersion liquid onto a substrate to form a cluster of semiconductor quantum dots, the semiconductor quantum dot dispersion liquid including semiconductor quantum dots each having a metal atom, first ligands coordinating to respective semiconductor quantum dots and having a main chain having 6 or more carbon atoms, and a first solvent; and
   a ligand exchange process of applying, to the cluster of semiconductor quantum dots, a solution that includes a second solvent and second ligands having a molecular chain length shorter than that of the first ligands, thereby replacing the first ligands coordinating to the semiconductor quantum dots by the second ligands, to form a semiconductor film having an average shortest inter-dot distance in the semiconductor quantum dots of more than 0.0 nm but less than 0.45 nm,
   wherein the second ligands are of at least one kind selected from the group consisting of a ligand represented by Formula (A), a ligand represented by Formula (B), and a ligand represented by Formula (C), or ligand agent molecules that include at least a thiocyan group and a metal ion:

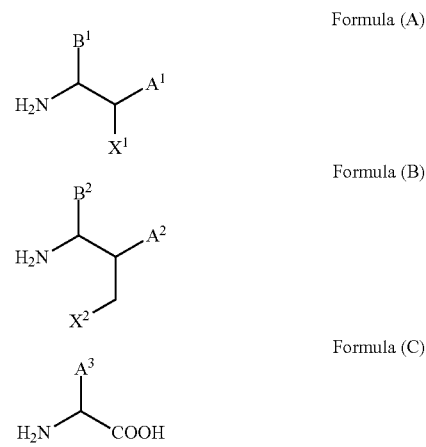

wherein, in Formula (A), $X^1$ represents —SH, —$N_2$, or —OH, and each of $A^1$ and $B^1$ independently represents a hydrogen atom or a substituent having from 1 to 10 atoms selected from the group consisting of an alkyl group having from 1 to 3 carbon atoms, an alkenyl group having 2 to 3 carbon atoms, an alkynyl group having from 2 to 4 carbon atoms, a cyclopropyl group, an alkoxy group having from 1 to 2 carbon atoms, an acyl group having from 2 to 3 carbon atoms, an alkoxycarbonyl group having from 2 to 3 carbon atoms, an acyloxy group having 2 carbon atoms, an acylamino group having 2 carbon atoms, a hydroxyalkyl group having from 1 to 3 carbon atoms, an aldehyde group (—COH), a hydroxy group (—OH), a carboxy group (—COOH), a sulfo group (—$SO_3H$), a phospho group (—OPO$(OH)_2$), an amino group (—$NH_2$), a carbamoyl group (—$CONH_2$), a cyano group (—CN), an isocyanate group (—N=C=O), a thiol group (—SH), a nitro group (—$NO_2$), a nitroxy group (—$ONO_2$), an isothiocyanate group (—NCS), a cyanate group (—OCN), a thiocyanate group (—SCN), an acetoxy group (OCOCH$_3$), an acetamide group (NHCOCH$_3$), a formyl group (—CHO), a formyloxy group (—OCHO), a formamide group (—NHCHO), a sulfamino group (—NHSO$_3$H), a sulfino group (—SO$_2$H), a sulfamoyl group (—SO$_2$NH$_2$), a phosphono group (—PO$_3$H$_2$), an acetyl group (—COCH$_3$), a halogen atom, and an alkali metal atom, provided that, when both $A^1$ and $B^1$ are hydrogen atoms, $X^1$ represents —SH or —OH; in Formula (B), $X^2$ represents —SH, —NH$_2$, or —OH and each of $A^2$ and $B^1$ independently represents a hydrogen atom or a substituent having from 1 to 10 atoms selected from the group consisting of an alkyl group having from 1 to 3 carbon atoms, an alkenyl group having 2 to 3 carbon atoms, an alkynyl group having from 2 to 4 carbon atoms, a cyclopropyl group, an alkoxy group having from 1 to 2 carbon atoms, an acyl group having from 2 to 3 carbon atoms, an alkoxycarbonyl group having from 2 to 3 carbon atoms, an acyloxy group having 2 carbon atoms, an acylamino group having 2 carbon atoms, a hydroxyalkyl group having from 1 to 3 carbon atoms, an aldehyde group (—COH), a hydroxy group (—OH), a carboxy group (—COOH), a sulfo group (—SO$_3$H), a phospho group (—OPO(OH)$_2$), an amino group (—NH$_2$), a carbamoyl group (—CONH$_2$), a cyano group (—CN), an isocyanate group (—N=C=O), a thiol group (—SH), a nitro group (—NO$_2$), a nitroxy group (—ONO$_2$), an isothiocyanate group (—NCS), a cyanate group (—OCN), a thiocyanate group (—SCN), an acetoxy group (OCOCH$_3$), an acetamide group (NHCOCH$_3$), a formyl group (—CHO), a formyloxy group (—OCHO), a formamide group (—NHCHO), a sulfamino group (—NHSO$_3$H), a sulfino group (—SO$_2$H), sulfamoyl group (—SO$_2$NH$_2$), a phosphono group (—PO$_3$H$_2$), an acetyl group (—COCH$_3$), a halogen atom, and an alkali metal atom; and, in Formula (C), A$^3$ represents a hydrogen atom or a substituent having from 1 to 10 atoms selected from the group consisting of an alkyl group having from 1 to 3 carbon atoms, an alkenyl group having 2 to 3 carbon atoms, an alkynyl group having from 2 to 4 carbon atoms, a cyclopropyl group, an alkoxy group having from 1 to 2 carbon atoms, an acyl group having from 2 to 3 carbon atoms, an alkoxycarbonyl group having from 2 to 3 carbon atoms, an acyloxy group having 2 carbon atoms, an acylamino group having 2 carbon atoms, a hydroxyalkyl group having from 1 to 3 carbon atoms, an aldehyde group (—COH), a hydroxy, group (—OH), a carboxy group (—COOH), a sulfo group (—SO$_3$H), a phospho group (—OPO(OH)$_2$), an amino group (—NH$_2$), a carbamoyl group (—CONH$_2$), a cyano group (—CN), an isocyanate group (—N=C=O), a thiol group (—SH), a nitro group (—NO$_2$), a nitroxy group (—ONO$_2$), an isothiocyanate group (—NCS), a cyanate group (—OCN), a thiocyanate group (—SCN), an acetoxy, group (OCOCH$_3$), an acetamide group (NHCOCH$_3$), a formyl group (—CHO), a formyloxy group (—OCHO), a formamide group (—NHCHO), a sulfamino group (—NHSO$_3$H), a sulfino group (—SO$_2$H), a sulfamoyl group (—SO$_2$NH$_2$), a phosphono group (—PO$_3$H$_2$), an acetyl group (—COCH$_3$), a halogen atom, and an alkali metal atom.

2. The method according to claim 1, wherein the semiconductor quantum dots have an average shortest inter-dot distance of less than 0.30 nm.

3. The method according to claim 1, wherein the semiconductor quantum dots have an average shortest inter-dot distance of less than 0.20 nm.

4. The method according to claim 1, wherein the semiconductor quantum dots comprise at least one selected from the group consisting of PbS, PbSe, InN, InAs, InSb, and InP.

5. The method according to claim 4, wherein the semiconductor quantum dots comprise PbS.

6. The method according to claim 1, wherein the semiconductor quantum dots have an average particle diameter of from 2 nm to 15 nm.

7. The method according to claim 6, wherein the semiconductor quantum dots comprise PbS.

8. The method according to claim 4, wherein the semiconductor quantum dots have an average particle diameter of from 2 nm to 15 nm.

9. The method according to claim 1, each of the first ligands has a main chain having 10 or more carbon atoms.

10. The method according to claim 1, wherein the first ligands include decanoic acid, lauric acid, myristic acid, palatine acid, stearic acid, behenic acid, oleic acid, erucic acid, oleylamine, dodecylamine, dodecanethiol, 1,2-hexadecanethiol, trioctyl phosphine oxide, or cetrimonium bromide, or any combination thereof.

11. The method according to claim 1, wherein the second ligands are represented by Formula (A).

12. The method according to claim 1, wherein the second ligands are represented by Formula (B).

13. The method according to claim 1, wherein the second ligands are represented by Formula (C).

* * * * *